United States Patent [19]
Khoury et al.

[11] Patent Number: 5,361,222
[45] Date of Patent: Nov. 1, 1994

[54] BINARY PHASE ONLY FILTER ASSOCIATIVE MEMORY

[75] Inventors: Jihad A. Khoury, Somerville; Jonathan S. Kane, Wayland; Philip R. Hemmer, Fitchbury; Charles L. Woods, Stow, all of Mass.

[73] Assignee: The United States of America as represented by the Secretary of the Air Force, Washington, D.C.

[21] Appl. No.: 906,987

[22] Filed: Jun. 30, 1992

[51] Int. Cl.[5] .......................... G06K 9/76; G11C 13/04
[52] U.S. Cl. ...................................... 365/49; 365/120; 365/127; 359/4; 359/22; 359/29
[58] Field of Search ................. 365/49, 120, 127, 122, 365/120; 350/3.82, 3.62, 3.75

[56] References Cited
U.S. PATENT DOCUMENTS 4,636,027  1/1987  Dube ................................. 365/125
4,837,843  6/1989  Owechko .......................... 365/125
4,860,253  8/1989  Owechko et al. ................. 365/125

OTHER PUBLICATIONS

Brown et al, "Computer-generated Binary Holograms", IBM J. Reasearch Development, Aug. 1, 1968, pp. 160-168.

Primary Examiner—Viet Q. Nguyen
Attorney, Agent, or Firm—Donald J. Singer; Robert L. Nathans

[57] ABSTRACT

An associative memory apparatus having a 2f Fourier transform optical correlation configuration wherein the correlation spots produced in the correlation plane are projected back by a mirror through the inverse Fourier transform lens and a phase correction reference image filter to produce the output image representing the best match between the input image and the associative memory reference images. A 4f Fourier transform embodiment projects the correlation spots forward through a second filter and transform means and the output image can be fed back to the input image display SLM to enhance the output image.

20 Claims, 2 Drawing Sheets

BINARY PHASE ONLY FILTER ASSOCIATIVE MEMORY

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of optical associative memories.

Associative memories are attractive in that they use part of the input datum to recall the entire datum by autoassociation or another desired datum by hetroassociation. There are two main approaches to implementing all optical associative memories. The first approach relies on optical vector matrix multiplication based on spatial light modulators and Light Emitting Diodes. The second approach which operates directly on two-dimensional input images utilizes holograms as the storage media and some kind of saturable gain element or aperture as the threshold mechanism. See U.S. Pat. No. 4,860,253 issued to Owechko and Soffer. This patent has a well written discussion of prior art optical associative memory systems. Holograms are used as memory elements because of their ability to store phase and amplitude information.

Binarizing the phase allows for simple construction of a static associative memory element utilizing current VLSI techniques, or simply through utilizing spatial light modulators. Binary Phase only Filters (BPOFs) have the advantage of high light throughput while only requiring approximately 1/100 of the memory storage space of a corresponding matched holographic filter. Most holographic associative memories share a similar architecture which comprises a correlator with a thresholding device such as a retroreflecting phase conjugate mirror utilizing a photorefractive crystal such as barium titanate, apinhole array in the correlation plane with an ordinary mirror, or an optical fiber used as a spatial filter.

BRIEF SUMMARY OF EMBODIMENTS OF THE INVENTION

It is a principal object of the invention to provide an associative memory system which eliminates the need for the aforesaid costly phase conjugator or other nonlinear thresholding device, along with holographic elements, and pin-hole devices. Preferred embodiments of the invention attain this goal by employing a phase-only or binary phase only filter as the memory element in a 2f Fourier transform optical correlator configuration. The resulting sharp autocorrelation peak combined with the 2f architecture allows the noise to be adequately separated from the signal so that, in one embodiment, a simple plain mirror is positioned in the correlation plane instead of the costly nonlinear threshold device. In a second embodiment, a spherical mirror is positioned in the correlation plane for input image translational invariance, and to force the noise to retroreflect with an incorrect curvature to propagate the noise out of the system.

BRIEF DESCRIPTION OF THE DRAWINGS

Other objects, features and advantages of the present invention will become apparent upon study of the following detailed description, taken in conjunction with the drawings in which.

DETAILED DESCRIPTION OF THE INVENTION

Figure 1:
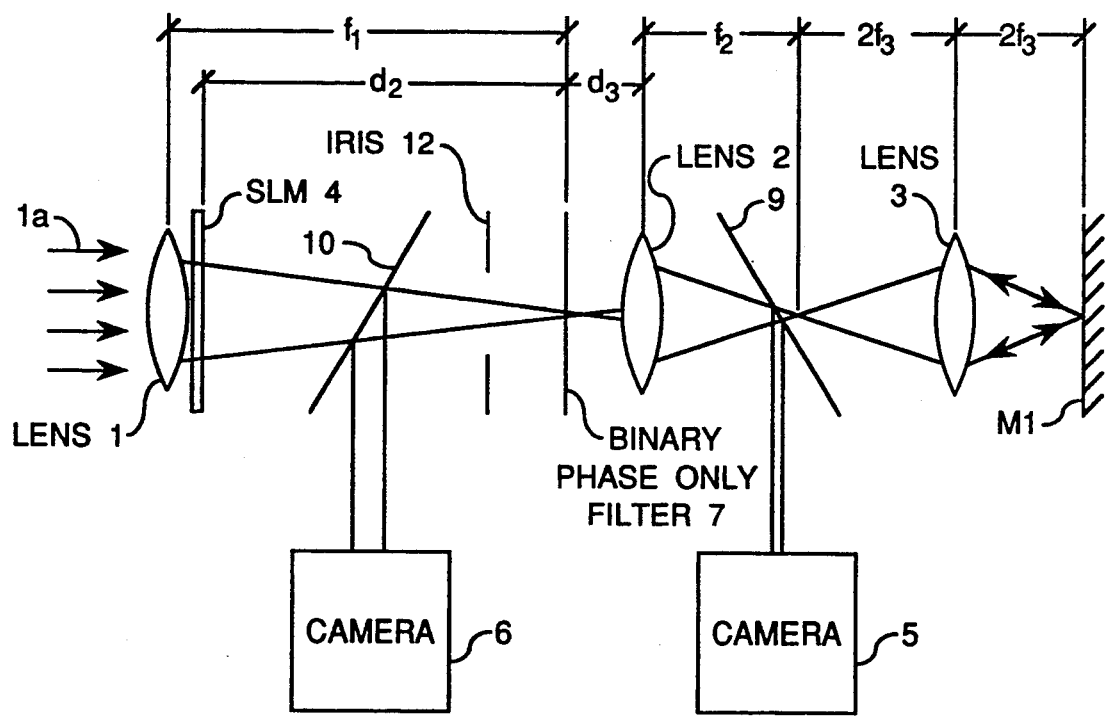
FIG. 1 illustrates a first embodiment of the invention.

Our experimental setup is sketched in FIG. 1. It is based on a 2f correlator architecture explained in detail in U.S. Pat. No. 5,073,006 issued to Horner and Makekau and incorporated by reference herein. This correlator architecture allows for a relatively shorter length of the correlator and variable scaling of the input image in the Fourier plane. The input image which in this case was a $128 \times 128$ pixilated gray level photographic slide is set just after first Fourier transform lens 1. Spatial light modulator (SLM) 4 would be substituted in a finalized design as the input image inputting means. The SLM 4 would be illuminated by coherent light $1a$ passing through lens 1. The Fourier transform of the input image contained within SLM 4, produced by lens 1, appears at the filter plane with an additional quadratic phase factor, as explained in the '006 patent. The binary phase-only filter 7 at the filter plane consists of a square $256 \times 256$ pixel array with each pixel having a dimension of 20 um on a side. In our case, the binarization follows the 'sine-transform'

$$T'(u,v) = \begin{cases} 1, 0 \leq \phi \leq \pi \\ -1, \pi \leq \phi \leq 2\pi \end{cases}$$

The binarization has the side effect of introducing a convolution term into the correlation plane at reflector means M1. However, this convolution term can be spatially separated from the correlation peak if a displacement is added in fabricating the filter. In our particular filter, a displacement of the input image "$f(x+x, y+y)$" was added where $x=64$ pixels and $y=64$ pixels for a $128 \times 128$ pixilated input image.

The Binary Phase Only Filter (BPOF) 7 produces a much more intense, narrow correlation peak than the classical matched filter. Computer simulations for our image show that the correlation peak intensity is 6.5 times that of a corresponding classically matched filter. These simulations also show that the area of the BPOF correlation peak is a factor of 50 less than that of the corresponding classical matched filter (measured from the Full-Width Half-Maximum points).

Thus the use of a BPOF as the associative memory element effectively concentrates most of the energy into a smaller area, providing a more delta-like correlation peak. Note that this is similar to sharpening the correlation peak through the use of a thresholding or quadratic nonlinearity in the correlation plane. Other phase correction filters such as non-binary phase-only filters, amplitude encoded phase filters and multilevel phase filters may also be employed in place of BPOF 7. Such phase correction filters represent a substantial improvement when used in associative memories, relative to prior holographic elements.

After the Fourier transform of the input image passes through the Binary Phase Only Filter 7, a diverging spherical wave is generated due to the quadratic phase factor instead of a plane wave as in 4f correlators. This diverging wave is focused to a point via second Fourier transform lens 2, in order to generate the correlation spot or peak. Lens 2 takes the inverse Fourier transform of the product of the Fourier transform of the input signal, and the second filter signal representing the reference image, as explained in the aforesaid '006 patent to Horner.

Figure 2:
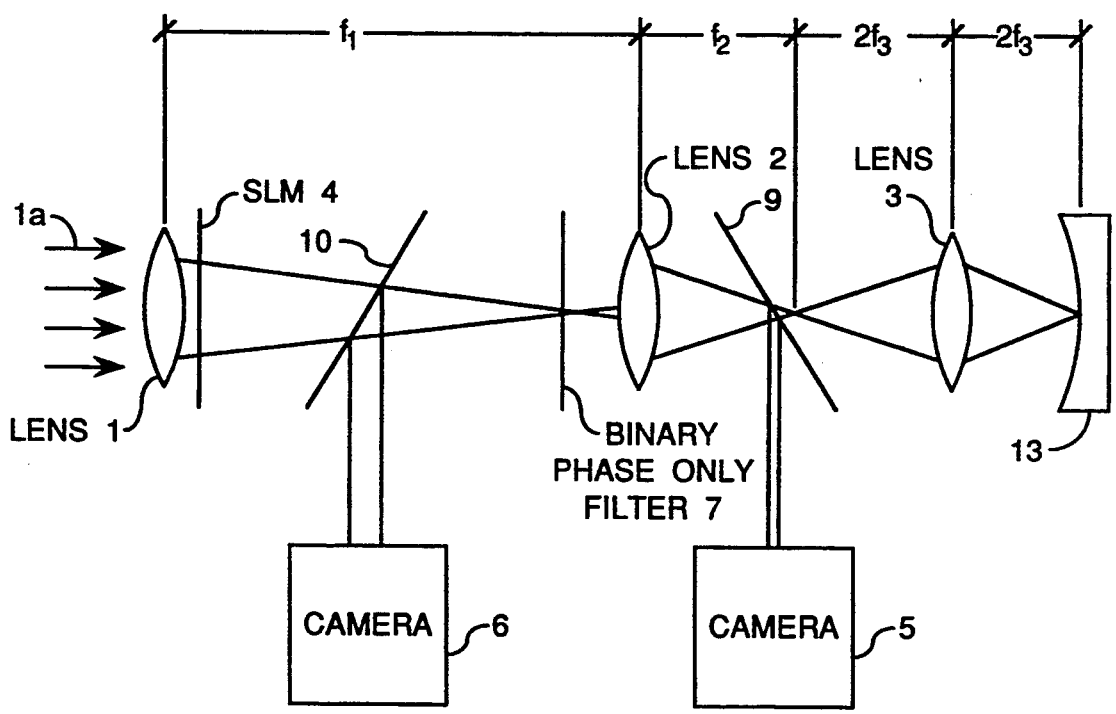
FIG. 2A illustrates a second embodiment of the invention utilizing a curved mirror at the correlation plane.
FIG. 2B illustrates a segmented mirror noise reduction device.

A plane mirror M1 or spherical mirror 13 in FIG. 2, can be placed at the correlation plane. For an associative memory with a Cat's Eye Reflector, which is invariant to input image translation, it is necessary that the radius of curvature of mirror 13 of FIG. 2, be equivalent to the effective focal length of the correlator.

The effective focal length of the correlator can be calculated from the parameters of the system such as the distance between the input image and the BPOF, the distance between the BPOF and the second lens 2, and the focal length of the second lens. The first parameter affects the quadratic phase factor such that the output from the BPOF is equivalent to a plane wave which was diverged by a negative lens of focal length $f' = -d2$. The effective focal length of the correlator is then calculated from classical optics: $1/f_{corr} = 1/f2 - 1/d2 + d3/d2f2$. These parameters are indicated in FIGS. 1 and 2. In the current setup we use an imaging system to allow us to simultaneously view the correlation plane via camera 5 and the associative memory output via camera 6. However, camera 5 and beamsplitter 9 are not required for an operative device. The correlation peak is then reimaged via lens 3 onto mirror M1 which provides the desired retroreflection back into the filter.

The retroreflection passes back through lens 2 as a converging spherical wave generating an edge-enhanced image, which is the impulse response of the BPOF, at the camera plane to be viewed by camera 6 via beamsplitter 10 without necessitating another Fourier transform lens. Thus, both mirrors in FIG. 1 and 2 act as projection means for projecting redirecting the correlation spots back through the filter 7, via lenses 2 and 3, and the resulting associative memory output image may be recorded by camera 6 optically coupled to beamsplitter 10.

The fact that the correlation spot does not occur at a distance f2 from lens 2 is fundamentally different than in the traditional four focal length (4f) architectures. For the 4f architectures, noise as well as signal terms would retroreflect back through the associative filter memory 7. In our setup, only the correlation spot is retroreflected efficiently. The noise terms are at the wrong curvature and hence are effectively apertured.

The use of a 2-f correlator with a BPOF as the memory element, produces an effective sharpening and narrowing of the correlation peak, due to the BPOF as discussed above, and introduces an effective aperture due to the 2-f architecture. It is both of these effects taken together that allows for the operation of the associative memory without necessitating any additional hardware in the correlation plane. Note that if a 4f correlator architecture was used with a plane mirror in the correlation plane, passing though the same BPOF twice would be equivalent to doing nothing. The presence of a pixilated SLM 4 at the input plane produces higher order Fourier transform images in the filter plane. The purpose of iris 12 is to block this noise from the system.

The discrimination ability of the BPOF can be demonstrated by several tests. For further details of these tests, reference may be made to a paper authored by the inventors and describing the present invention in APPLIED OPTICS/Vol. 31, No. 11, Apr. 10, 1992. The first test we performed was to rotate the original image by 90 degrees such that there was no correlation peak retroreflected. This test ensures that the energy in the system remains the same and the correlation spot is eliminated. A second test was to use an image not contained in the BPOF. An Air Force Resolution Chart was used which has several edges. This test should emphasize any cross correlations due to high spatial frequency or edges correlated with edges of the stored memory. A third test was to remove the input image slide and allow just the laser beam to pass through the system. This kind of test emphasizes low frequency or DC cross-correlations between the input and stored image. The expected correlation output in this case is a diverging spherical wave. When this is retroreflected, the resultant output should be a plane wave. However in the correlation plane, we observed a mottled pattern with lighter and darker regions, which we believe is due to diffraction from the limited pixel size of the BPOF. This mottled pattern reconstructed the image in the associative memory output. It is clear that preprocessing any input by blocking the DC before passing through the BPOF will greatly improve the signal to noise ratio.

In a real system however, dynamic thresholding is difficult to achieve. In our setup of FIG. 2, we were able to construct a configuration that allowed most of the noise to propagate out of the system. Since the noise is diffusive in nature, this can be used to advantage with a spherical mirror 13 to force the noise to retroreflect with an incorrect curvature. That is, a highly mismatched mirror radius can reduce noise but the input image should now be precisely centered. The result is that the noise propagates out of the system and energy normalization is not necessary. We found that the translation invariance of the system was also affected with movement of the lens mirror combination. A plane mirror in the image correlation plane allowed a translation of 1.4 mm in the image plane which represents a translation of 23 percent of the input image size.

An attempt was made to improve the translation invariance of the system by using a curved mirror 13 with the radius of curvature of the mirror equivalent to the focal length of the correlator. Unfortunately as the translation invariance improved, the retroreflected noise was large when compared to the signal. In this case, a saturable absorber or thresholding device may be necessary for the invariant translation device. It is clear therefore that there is a tradeoff between translation invariance and signal to noise ratio.

Figure 2A:
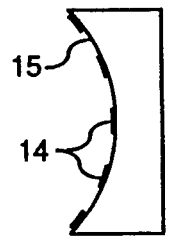

Another possible noise reduction technique is to use a segmented mirror or an array of small mirrors 14 separated from each other on a non-reflective curved element 15 as shown in FIG. 2A. Each separate mirror 14 in the mirror array has the correct tilt for the desired correlation spot retro-reflection but only at the position of the particular correlation spot associated therewith. The result is to deflect noise energy separated from or in between these positions out of the optical system. Each small mirror 14 may be straight or curved.

Figure 4:
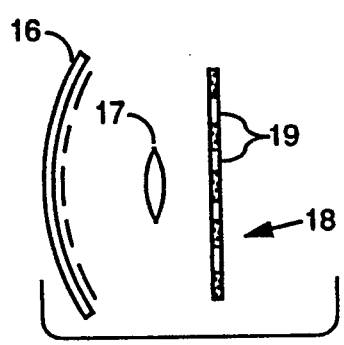
FIG. 4 illustrates a second noise reduction device.

Another somewhat similar technique is illustrated in FIG. 4. An apertured plate 18 is provided having an array of apertures 19 therein, each aperture positioned at an associated correlation spot. For example if there are nine spots, there would be nine apertures. Lens 17 focuses the apertured plate on mirror 16, and as a result, the need for the segmented mirrors of FIG. 2A is eliminated. This would appear to be less costly to manufacture than the less preferred FIG. 2A embodiment, since the holes 14 could be easily drilled into the plate 18.

As has been previously mentioned, a phase conjugate mirror can be used as a thresholding device. If we can produce a faithful conjugate of both the correlation and the convolution then the grey scale image will be produced at the associative memory output as a consequence of energy conservation. The correlation will be responsible for reconstructing the edge enhanced portion of the image and the convolution will be responsible for reconstructing the dc portion of the image. Classically, this may be achieved by placing a fresnel lens or hologram on the back of the BPOF such that the correlation and convolution both focus to a point at the same location.

A second possible method (not tried) of achieving a grey level image from this associative memory is to pass the output image through a filter with a transmittance inversely proportional to spatial frequency.

Finally, we have demonstrated the operation of this device for a single memory. Preferrably however, multiple memories would be stored within the filter. The idea of multiplexing several memories onto a single filter has been studied. Cottrell et al report recording 104 images in a single 128×128 computer generated BPOF with a resultant signal to noise ratio of 4 in an optical correlator setup. See Applied Optics 26, 934–937 (1987). Admittedly, associative memory architectures are more susceptible to noise than correlator architectures in that the contribution from the weak sidelobes across the entire plane can become a significant source of noise. For this reason, most optical implementations have been restricted to just a few memories. In our case, this also might be the fundamental limit, however, it is hoped that the higher peak to secondary ratio and more narrow correlation peak of the BPOF combined with thresholding techniques will yield more memory storage capability. In the present architecture, the association is a set or class memory where if any one member of the set of is presented, then the entire set of memories is retrieved. In the event a linear associative memory is desired where each memory is read out separately, then some method must be devised to suppress the undesired memories and allow only the memory of interest to be retrieved. In our architecture, an on-axis window could be introduced similar to that reported by Paek et al.; see Opt. Eng. 26, 428–433 (1987). In their architecture, a single hologram of spatially multiplexed images is written with an off-axis reference beam. Each input that is contained in the memory generates all of the memories at the output, but a window correctly registered allows only the interest to pass through the output.

In their experiment, Paek et al found it necessary to introduce a pinhole array with 350 um pinholes in the correlation plane. However, our correlation spots are about this diameter and off axis noise is retroreflected with the wrong curvature. This suggests then that for small numbers of memories a pinhole array might not be necessary at least for orthogonal data sets. However, as the number of memories increase, then the addition of some thresholding and/or aperturing scheme would appear to be necessitated.

Another recent method to multiplex several memories is to use holograms in spectral hole burning materials which can be read-out without crosstalk by changing the frequency of the input light.

In sum, a Binary Phase Only Filter Associative Memory has been successfully demonstrated for one memory by retroreflecting the correlation peak. This use of a BPOF incorporated into a 2f correlator architecture, allowed us to achieve previously reported results without the use of a thresholding device in the correlation plane. A method is also discussed for extending this technique to multiple memories. Although the associative memory output currently is working in edge enhanced mode, it is possible to low pass filter the output such that a grey scale image can be reconstructed. In addition, the phase-only nature of the device leaves open the possibility of using SLMs as memory elements.

Figure 3:
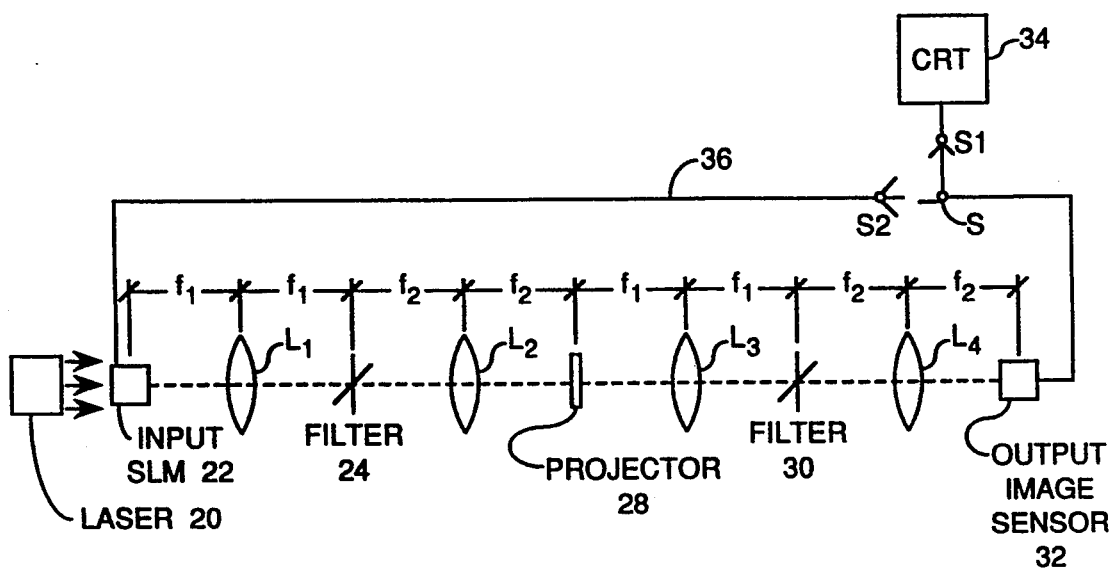
FIG. 3 illustrates an optional output image feedback means for enhancing the best match associative memory output image with the input image.

Recall that the aforesaid mirrors project the correlation spots back through the second Fourier transform lens and the filter to produce the associative memory output image. In FIG. 3, the projection means projects the spot images forward to a projection filter, separate from the BPOF 7, via an additional Fourier transform lens 13. SLM 22 illuminated by laser 20 initially contains the input image which is Fourier transformed by L1. Filter 24 corresponds to BPOF 7. The resulting correlation spots produced at projection means 28 by transform lens L2 are projected forward through L3 and projection filter 30. Since L3 and L4 are Fourier transform lenses, the associated memory output image is recreated at output image sensor 32. The output of image sensor 32 may be directly displayed by CRT 34 where switch S is in the S1 position, or may be fed back to the input plane via 36, when the switch is in the S2 position. Hence, the filter means in this embodiment comprises filter 24 and projection filter 30. The purpose of the feedback mode is to enhance the best match output image of the associated memory with respect to the input image. Both image sensor 32 and electrically addressed SLM 22, electrically coupled thereto, constitute an output image feedback means. Of course the output image could be optically coupled to the input plane by relay optical components rather than electronic components for enhancing the associate memory output image. The forward projection means 28 could comprise a two-dimensional array of weak lenslets centered on correlation spot locations or, for that matter, an absence of any optical elements. In the FIG. 3 embodiment, the aforesaid noise reduction v. input translation invariance may be implemented by a threshold transmission/reflection device in the correlation plane, an array of apodized apertures in the correlation plane or the weak lenslet array, each lenslet being centered on correlation spot locations.

Since other embodiments will become apparent to the skilled worker in the art, the scope of the invention is to be defined by the terms of the following claims and art recognized equivalents thereof. For example, the term "phase correction filter" is intended to cover phase-only filters, binary phase-only filters, amplitude encoded phase filters and multilevel phase filters, e.g. trinary.

We claim:

1. An optical associative memory apparatus comprising:
   (a) a first optical Fourier transform means for forming a Fourier transform of a first input image signal;
   (b) an associative memory means including phase correction filter means providing a second signal including reference image information;
   (c) second optical Fourier transform means for taking the inverse Fourier transform of the product of the Fourier transform of the first signal and the second signal and for forming said inverse Fourier transform which includes one or more correlation spots indicative of the correlation function between said first signal and said second signal; and
   (d) projection means for projecting images of said correlation spots through said filter means to create an associative memory image.

2. The apparatus of claim 1 wherein said projection means includes means for redirecting light from the correlation spots back through the second optical Fourier transform means and said filter means to form an associative memory output image.

3. The apparatus of claim 1 wherein said filter means comprises a first filter and a second filter separate from said first filter, and said projection means includes means for projecting light from the correlation spots forward through said second filter to form an associative memory output image.

4. The apparatus of claim 2 wherein said projection means comprises a retro-reflector.

5. The apparatus of claim 2 wherein said projection means comprises a mirror means.

6. The apparatus of claim 5 wherein said mirror means comprises a spherical mirror.

7. The apparatus of claim 5 wherein said mirror means comprises a curved retroreflective mirror.

8. The apparatus of claim 1 further including means for eliminating the projection of light signals which may be present between said correlation spots and being representitive of noise, through the second optical Fourier transform means and the filter means, comprising an apertured plate, a mirror and means for imaging said apertured plate upon said mirror.

9. The apparatus of claim 2 wherein said first and second Fourier transform means, and said filter means are arranged in a 2f optical correlator configuration.

10. The apparatus of claim 4 wherein said first and second Fourier transform means, and said filter means are arranged in a 2f optical correlator configuration.

11. The apparatus of claim 5 wherein said first and second Fourier transform means, and said filter means are arranged in a 2f optical correlator configuration.

12. The apparatus of claim 7 wherein said first and second Fourier transform means, said input image and said filter means are arranged in a 2f optical correlator configuration.

13. The apparatus of claim 2 wherein said first and second Fourier transform means, said input image and said filter means are arranged in a 2f optical correlator configuration, and said projection means comprises a plane mirror.

14. An optical associative memory comprising:
   (a) a first optical Fourier transform means for forming a Fourier transform of a first input image signal;
   (b) an associative memory means including filter means providing a second signal including reference image information;
   (c) second optical Fourier transform means for taking the inverse Fourier transform of the product of the Fourier transform of the first signal and the second signal and for forming said inverse Fourier transform which includes one or more correlation spots indicative of the correlation function between said first signal and said second signal; and
   (d) projection means comprising a curved retroreflective mirror means for projecting said correlation spots back through said filter means to create an associative memory image.

15. An optical associative memory comprising:
   (a) a first optical Fourier transform means for forming a Fourier transform of a first input image signal present at an image input means;
   (b) an associative memory means including a phase correction filter providing a second signal including reference image information;
   (c) second optical Fourier transform means for taking the inverse Fourier transform of the product of the Fourier transform of the first signal and the second signal and for forming said inverse Fourier transform which includes one or more correlation spots indicative of the correlation function between said first signal and said second signal; and
   (d) projection means for projecting said correlation spots through a projection filter, separate from said phase correction filter, for creating an associative memory output image.

16. Apparatus of claim 15 including output image feedback means for projecting said associative memory output image back to said image input means for enhancing said associative memory output image.

17. Apparatus of claim 16 wherein said output image feedback means includes an image sensor electrically coupled to an electrically addressed image display device.

18. The apparatus of claim 2 wherein said projection means comprises an array of mirrors, and wherein each mirror is tilted to retro-reflect a correlation spot associated with each mirror.

19. An optical associative memory comprising:
   (a) a first optical Fourier transform means for forming a Fourier transform of a first input image signal;
   (b) an associative memory means including filter means providing a second signal including reference image information;
   (c) second optical Fourier transform means for taking the inverse Fourier transform of the product of the Fourier transform of the first signal and the second signal and for forming said inverse Fourier transform which includes one or more correlation spots indicative of the correlation function between said first signal and said second signal; and
   (d) projection means for projecting said correlation spots back through said filter means to create an associative memory image comprising an array of mirrors, and wherein each mirror is tilted to retro-reflect a correlation spot associated with each mirror.

20. An optical associative memory comprising:
   (a) a first optical Fourier transform means for forming a Fourier transform of a first input image signal;
   (b) an associative memory means including filter means providing a second signal including reference image information;
   (c) second optical Fourier transform means for taking the inverse Fourier transform of the product of the Fourier transform of the first signal and the second signal and for forming said inverse Fourier transform which includes one or more correlation spots indicative of the correlation function between said first signal and said second signal; and (d) projection means for projecting said correlation spots back through said filter means to create an associative memory image, and including means for eliminating the projection of light signals which may be present between said correlation spots and being representative of noise, comprising an apertured plate, a mirror and means for imaging said apertured plate upon said mirror.

* * * * *